(12) United States Patent
Okamura et al.

(10) Patent No.: US 10,319,759 B2
(45) Date of Patent: Jun. 11, 2019

(54) IMAGE PICKUP ELEMENT MOUNTING SUBSTRATE AND IMAGE PICKUP DEVICE

(71) Applicant: KYOCERA Corporation, Kyoto-shi, Kyoto (JP)

(72) Inventors: Takuji Okamura, Kyoto (JP); Akihiko Funahashi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 47 days.

(21) Appl. No.: 15/316,916

(22) PCT Filed: Jun. 24, 2015

(86) PCT No.: PCT/JP2015/068213
§ 371 (c)(1),
(2) Date: Dec. 7, 2016

(87) PCT Pub. No.: WO2015/199134
PCT Pub. Date: Dec. 30, 2015

(65) Prior Publication Data
US 2017/0104022 A1    Apr. 13, 2017

(30) Foreign Application Priority Data

Jun. 25, 2014  (JP) ................... 2014-130413

(51) Int. Cl.
*H01L 27/146* (2006.01)
*H04N 5/225* (2006.01)
(Continued)

(52) U.S. Cl.
CPC .. *H01L 27/14618* (2013.01); *H01L 27/14636* (2013.01); *H01L 27/14643* (2013.01);
(Continued)

(58) Field of Classification Search
CPC ........... H01L 27/14618; H01L 31/0203; H01L 23/041–23/057
See application file for complete search history.

(56) References Cited

U.S. PATENT DOCUMENTS 8,193,555 B2 *  6/2012  Lin ................... H01L 27/14618
                                                              257/294
2002/0044215 A1  4/2002  Takagi et al.
(Continued)

FOREIGN PATENT DOCUMENTS

CN  101316485 A   12/2008
JP  60-33457 U    3/1985
(Continued)

OTHER PUBLICATIONS

International Search Report, PCT/JP2015/068213, dated Jul. 28, 2015, 2 pgs.

Primary Examiner — Stephen W Smoot
Assistant Examiner — Sun Mi Kim King
(74) Attorney, Agent, or Firm — Volpe and Koenig, P.C.

(57) ABSTRACT

An image pickup element mounting substrate includes: a frame body composed of an insulating layer, a through hole being defined by an internal periphery of the frame body; an electronic component mounted on a lower surface side of the frame body; and a flat plate which is disposed on a lower surface of the frame body and covers an opening of the through hole while being partly kept in out-of-contact with the electronic component, the flat plate including an image pickup element mounting section at a part of an upper surface thereof which part is surrounded by the frame body, a lower surface of the electronic component being located above a level of a lower surface of the flat plate.

10 Claims, 7 Drawing Sheets

(51) Int. Cl.
*H05K 1/18* (2006.01)
*H05K 3/46* (2006.01)
*H05K 3/00* (2006.01)

(52) U.S. Cl.
CPC ........... *H04N 5/2253* (2013.01); *H05K 1/184* (2013.01); *H05K 3/4697* (2013.01); *H01L 2224/48091* (2013.01); *H01L 2224/49175* (2013.01); *H01L 2924/16195* (2013.01); *H05K 1/183* (2013.01); *H05K 3/005* (2013.01); *H05K 3/4629* (2013.01); *H05K 2203/063* (2013.01)

(56) References Cited

U.S. PATENT DOCUMENTS

| | | |
|---|---|---|
| 2004/0263671 A1 | 12/2004 | Takagi et al. |
| 2011/0286736 A1* | 11/2011 | Aizawa ............. H01L 27/14618 396/529 |
| 2012/0069230 A1 | 3/2012 | Takagi et al. |
| 2014/0042578 A1 | 2/2014 | Takagi et al. |

FOREIGN PATENT DOCUMENTS

| | | |
|---|---|---|
| JP | 2-62743 U | 5/1990 |
| JP | 10-32323 A | 2/1998 |
| JP | 2006-129255 A | 5/2006 |

\* cited by examiner (a)

(b)

IMAGE PICKUP ELEMENT MOUNTING SUBSTRATE AND IMAGE PICKUP DEVICE

TECHNICAL FIELD

The present invention relates to an image pickup element mounting substrate for mounting an image pickup element such for example as CCD (Charge Coupled Device) or CMOS (Complementary Metal Oxide Semiconductor), and an image pickup device.

BACKGROUND ART

Heretofore there is known an image pickup device constructed by mounting an image pickup element on an image pickup element mounting substrate. As an example of the image pickup element mounting substrate for use in such an image pickup device, there is one comprising a frame body composed of insulating layers, and a flat plate joined to a lower surface of the frame body. In such an image pickup element mounting substrate, an external circuit connection electrode is disposed on an upper surface or side surface of the frame body for connection with an external circuit.

The recent demand for further and further miniaturization in image pickup devices has led to difficulties in leaving a space for the mounting of an external circuit connection electrode and an electronic component on the upper surface of the frame body. With this in view, for example, Japanese Unexamined Patent Publication JP-A 2006-129255 discloses techniques for mounting an electronic component on the lower surface of the frame body, so that the upper surface or side surface of the frame body may be connected with an external circuit.

However, due to variations in accuracy of dimension in an electronic component in itself, variations in accuracy of position and in accuracy of dimension resulting from the production of a pad for the connection of the electronic component, and variations in accuracy of mounting position in the course of mounting of the electronic component, it has been difficult to render the lower surfaces of a plurality of electronic components flush with each other after the mounting. Consequently, the level of the inside of the image pickup element mounting substrate could vary from place to place. This causes the image pickup device to be inclined when mounted in an external circuit or external housing, in consequence whereof there results misalignment in optical axis or image noise as a matter of concern.

An object of the invention is to provide an image pickup element mounting substrate capable of reducing an inclination of an image pickup device caused by placement of an electronic component, and an image pickup device which employs this image pickup element mounting substrate.

SUMMARY OF INVENTION

An image pickup element mounting substrate in accordance with one aspect of the invention comprises: a frame body composed of an insulating layer, a through hole being defined by an internal periphery of the frame body; an electronic component mounted on a lower surface side of the frame body; and a flat plate which is disposed on a lower surface of the frame body and covers an opening of the through hole while being partly kept in out-of-contact with the electronic component, the flat plate comprising an image pickup element mounting section at a part of an upper surface thereof which part is surrounded by the frame body, a lower surface of the electronic component being located above a level of a lower surface of the flat plate.

An image pickup device in accordance with one aspect of the invention comprises: the image pickup element mounting substrate described above; an image pickup element mounted on the image pickup element mounting section of the flat plate; and a lid body which is joined to an upper surface of the frame body and seals an interior of the frame body.

DESCRIPTION OF EMBODIMENTS

Hereinafter, several exemplified embodiments of the invention will be described with reference to drawings. In the following description, a construction comprising an image pickup element mounting substrate, an image pickup element mounted thereon, and a lid body joined to the upper surface of the image pickup element mounting substrate will be defined as an image pickup device. As to the orientation of the image pickup element mounting substrate and the image pickup device, each side may be either an upper surface or a lower surface. However, for purposes of convenience, the terms "upper surface" and "lower surface" are used on the basis of an x-y-z rectangular coordinate system in which a positive direction along the z axis corresponds to an upward direction.

First Embodiment

An image pickup device 21 and an image pickup element mounting substrate 1 in accordance with a first embodiment of the invention will be described with reference to FIGS. 1 and 2. The image pickup device 21 in this embodiment comprises the image pickup element mounting substrate 1 and an image pickup element 10.

Figure 1:
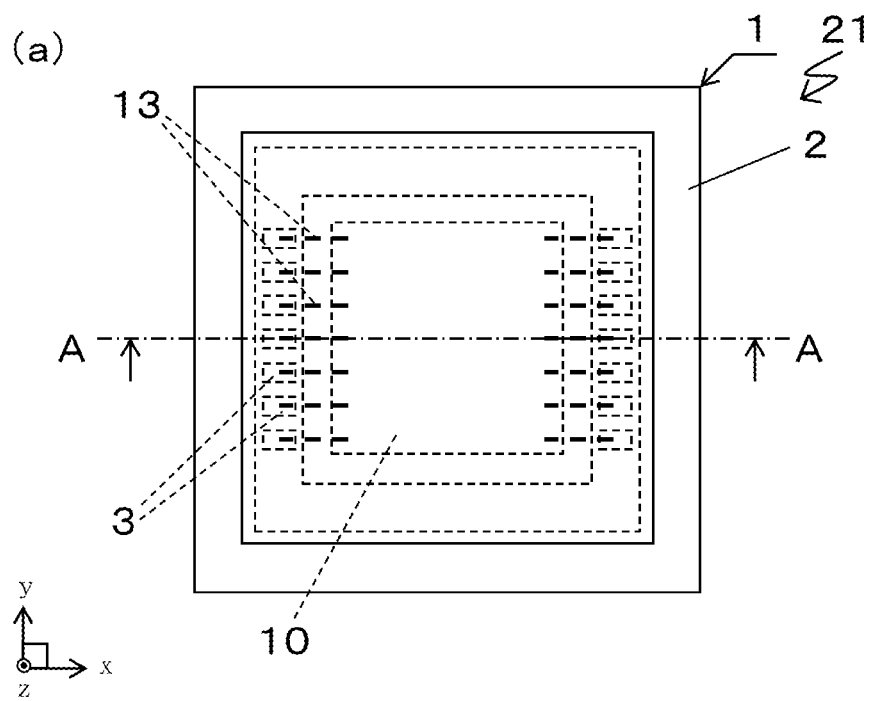
FIG. 1(a) is a top view showing the appearance of an image pickup element mounting substrate and an image pickup device in accordance with a first embodiment of the invention.
FIG. 1(b) is a vertical sectional view taken along the line A-A shown in FIG. 1(a)
Figure 1:
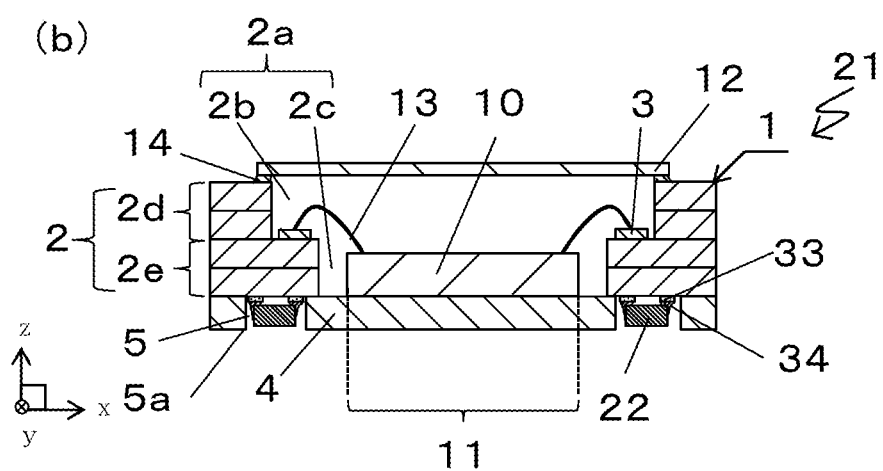
Figure 2:
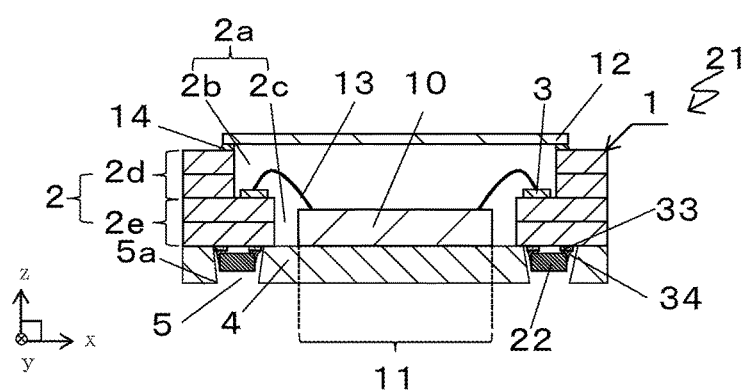
FIG. 2 is a vertical sectional view showing the appearance of the image pickup element mounting substrate and the image pickup device in accordance with another example of the first embodiment of the invention.

In the example shown in FIGS. 1 and 2, the image pickup element mounting substrate 1 comprises: a frame body 2 composed of an insulating layer, a through hole 2a being defined by an internal periphery of the frame body 2; an electronic component 22 mounted on a lower surface side of the frame body 2; and a flat plate 4 which is disposed on the lower surface of the frame body 2 and covers the opening of the through hole 2a while being kept in out-of-contact with the electronic component 22, the flat plate 4 comprising an image pickup element mounting section 11 at a part of an upper surface thereof which part is surrounded by the frame body 2, Wherein a lower surface of the electronic component 22 is located above a level of a lower surface of the flat plate 4.

In the example shown in FIGS. 1 and 2, the frame body 2 is composed of the insulating layer, the through hole 2a being defined by the internal periphery of the frame body 2. In the example shown in FIGS. 1 and 2, the frame body 2 made of an insulating layer comprises a first frame body 2d provided with a first through hole 2b and a second frame body 2e provided with a second through hole 2c which is smaller than the first through hole 2b. The first frame body 2d overlies an upper surface of the second frame body 2e, and, the first through hole 2b and the second through hole 2c combine to form the through hole 2a of the frame body 2. Moreover, an inner side surface of the first frame body 2d and the upper surface of the second frame body 2e define a shoulder where an image pickup element connection pad 3 is disposed. Moreover, as shown in FIGS. 1 and 2, on a part of the lower surface of the frame body 2 which part is exposed at a flat-plate through hole 5, there are arranged a plurality of electronic component connection pads 33 to which the electronic component 22 is electrically connected.

As the material of construction of the first frame body 2d and the second frame body 2e constituting the frame body 2, for example, electrically insulating ceramics or resin (plastics) is used.

Examples of the electrically insulating ceramics used for the first frame body 2d and the second frame body 2e constituting the frame body 2 include an aluminum oxide sintered body, a mullite sintered body, a silicon carbide sintered body, an aluminum nitride sintered body, a silicon nitride sintered body, and a glass ceramics sintered body.

Examples of the resin used for the first frame body 2d and the second frame body 2e constituting the frame body 2 include epoxy resin, polyimide resin, acrylic resin, phenol resin, and fluorine resin. Examples of the fluorine resin include polyester resin and tetrafluoroethylene resin.

In the example shown in FIGS. 1 and 2, the first frame body 2d and the second frame body 2e constituting the frame body 2 are each constructed by stacking a plurality of insulating layers made of the above-described material together vertically.

Each of the first frame body 2d and the second frame body 2e constituting the frame body 2 may be composed of two insulating layers as shown in FIGS. 1 and 2, or composed either of a single insulating layer or of three or more insulating layers. In the example shown in FIG. 1, the first frame body 2d and the second frame body 2e constituting the frame body 2 are each composed of two insulating layers, and, a plurality of the image pickup element connection pads 3 are disposed on the above-described shoulder.

Moreover, an external circuit connection electrode is disposed on the upper surface, side surface, or lower surface of the frame body 2. The external circuit connection electrode is provided to establish electrical connection between the image pickup device 21 and an external circuit board or an external apparatus, for example.

In the interior of the frame body 2, for example, there are provided an internal wiring line formed between the insulating layers, and a through conductor for connecting the internal wiring lines together in the vertical direction. The internal wiring line or the through conductor may be exposed at the surface of the frame body 2. The external circuit connection electrode, the image pickup element connection pad 3, and the electronic component connection pad 33 may be electrically connected to each other by the internal wiring line or the through conductor.

Moreover, for example, the first frame body 2d and the second frame body 2e may be connected to each other at parts of their through conductors which are exposed at the surface of the frame body as described above.

When the frame body 2 is formed of electrically insulating ceramics, the image pickup element connection pad 3, the external circuit connection electrode, the internal wiring line, the through conductor, and the electronic component connection pad 33 are made of tungsten (W), molybdenum (Mo), manganese (Mn), silver (Ag), or copper (Cu), or an alloy containing at least one or more metal materials selected from the aforenamed metal materials, for example. Moreover, when the frame body 2 is formed of resin, the image pickup element connection pad 3, the external circuit connection electrode, the internal wiring line, the through conductor, and the electronic component connection pad 33 are made of copper (Cu), gold (Au), aluminum (Al), nickel (Ni), chromium (Cr), molybdenum (Mo), or an alloy containing at least one or more metal materials selected from the aforenamed metal materials, for example.

A plating layer may be formed on the exposed surfaces of the image pickup element connection pad 3, the external circuit connection electrode, the internal wiring line, the through conductor, and the electronic component connection pad 33. According to this constitution, it is possible to provide protection for the exposed surfaces of the image pickup element connection pad 3, the external circuit connection electrode, the internal wiring line, the through conductor, and the electronic component connection pad 33 from oxidation. Moreover, According to this constitution, it is possible to achieve good electrical connection between the image pickup element connection pad 3 and the image pickup element 10 via a connecting member 13 such as a bonding wire, good electrical connection between the external circuit connection electrode and an external circuit board, and good electrical connection between the electronic component 22 and the electronic component connection pad 33. For example, the plating layer may be of a coating of a nickel (Ni) plating layer having a thickness of 0.5 to 10 μm, or may be obtained by coating this Ni plating layer and a gold (Au) plating layer having a thickness of 0.5 to 3 μm one after the other.

As in the example shown in FIGS. 1 and 2, the flat plate 4 is disposed on the lower surface of the frame body 2 and covers the lower opening of the through hole 2a, and has the image pickup element mounting section 11 located centrally of its upper surface.

In the example shown in FIGS. 1 and 2, the image pickup element 10 is mounted on the image pickup element mounting section 11, while being housed in a recess defined by the inner wall of the through hole 2a of the frame body 2 and the upper surface of the flat plate 4.

As in the example shown in FIGS. 1 and 2, an outer edge of the flat plate 4 may overlap with an outer edge of the frame body 2 as seen in a plan view, or, alternatively, it may be located inwardly from the outer edge of the frame body 2, or located outwardly from the outer edge of the frame body 2, as seen in a plan view. Moreover, when the flat plate 4 is configured so that the outer edge thereof is located outwardly from the outer edge of the frame body 2, it is advisable to form a through hole or cutaway in the outside region of the flat plate 4 located outwardly from the frame body 2. For example, the through hole or cutaway is used as a hole for fixedly connecting the image pickup device 21 to an external apparatus.

As the material of construction of the flat plate 4, for example, electrically insulating ceramics, a metal material, or resin (plastics) is used.

Examples of the electrically insulating ceramics used for the flat plate 4 include an aluminum oxide sintered body, a mullite sintered body, a silicon carbide sintered body, an aluminum nitride sintered body, a silicon nitride sintered body, and a glass ceramics sintered body. Note that a circuit may be formed on the surface or in the interior of the flat plate 4, and, in this case, electrical connection may be established with a connection electrode disposed on the lower surface of the frame body 2 or a through electrode exposed at the lower surface of the frame body 2.

Moreover, when the flat plate 4 is formed of electrically insulating ceramics, the frame body 2 and the flat plate 4 may be joined to each other via a joining material made of a brazing material, thermosetting resin, low-melting-point glass, or other material. As the thermosetting resin, for example, bisphenol A liquid epoxy resin is used.

Examples of the metal material used for the flat plate 4 include stainless steel (SUS), a Fe—Ni—Co alloy, 42 Alloy, copper (Cu), and a copper alloy. Moreover, when the frame body 2 is formed of an aluminum oxide sintered body having a coefficient of thermal expansion of about $5 \times 10^{-6}/°$ C. to $10 \times 10^{-6}/°$ C., the flat plate 4 may be made of stainless steel having a coefficient of thermal expansion of about $10 \times 10^{-6}/°$ C. (SUS 410). In this case, the difference in thermal shrinkage and thermal expansion between the frame body 2 and the flat plate 4 is so small that relaxation of thermal stress can be achieved in the step of joining the frame body 2 and the flat plate 4 together or in the course of mounting of the electronic component 22, thus reducing deformation of the image pickup element mounting section 11. This makes it possible to reduce degradation in image quality caused by misalignment in optical axis between the image pickup element 10 and a lens.

Moreover, when the flat plate 4 is formed of a metal material, the frame body 2 and the flat plate 4 may be joined to each other via a joining material made of a brazing material, thermosetting resin, low-melting-point glass, or other material. As the thermosetting resin, for example, bisphenol A liquid epoxy resin may be used.

Examples of the resin used for the flat plate 4 include epoxy resin, polyimide resin, acrylic resin, phenol resin, and fluorine resin. Examples of the fluorine resin include polyester resin and tetrafluoroethylene resin. Note that a circuit may be formed on the upper or lower surface of the flat plate 4. In this case, the flat plate 4 may be electrically connected with the external circuit connection electrode disposed on the lower surface of the frame body 2.

Moreover, when the flat plate 4 is formed of a resin material, the frame body 2 and the flat plate 4 may be joined to each other via a joining material made of thermosetting resin, for example. As the thermosetting resin, for example, bisphenol A liquid epoxy resin is used.

Moreover, when the flat plate 4 is made of electrically insulating ceramics or a resin material, and has a circuit formed on a surface thereof or in an interior thereof, as the joining material used for the joining together of the frame body 2 and the flat plate 4, an electrically conductive joining material such as anisotropic conductive resin (ACF) or solder is used. The use of the conductive joining material makes it possible to achieve both the joining together of the frame body 2 and the flat plate 4 and electrical connection between their electrodes.

It is preferable that the frame body 2 and the flat plate 4 are joined together by a joining material which is not denatured under application of heat in the course of mounting of the image pickup element 10 or mounting of the electronic component 22. Examples of such a joining material include bisphenol A liquid epoxy resin. In this case, separation of the flat plate 4 from the frame body 2 can be suppressed satisfactorily in the course of mounting of the image pickup element 10 or mounting of the electronic component 22.

As in the example shown in FIGS. 1 and 2, the image pickup element mounting substrate 1 is provided with the flat-plate through hole 5 having an opening 5a through the upper and lower surfaces of the flat plate 4, and further includes the electronic component 22 housed inside the opening 5a. The lower surface of the electronic component 22 is located above the level of the lower surface of the flat plate 4. The flat plate 4 is provided with the flat-plate through hole 5 formed in a position which overlaps with the electronic component 22 so that the flat plate 4 may be partly kept in out-of-contact with the electronic component 22. The constitution wherein the flat plate 4 is partly kept in out-of-contact with the electronic component 22 means that the surface of the electronic component 22 may be only partly brought into contact with the flat plate 4 as long as the lower surface of the electronic component 22 is located above the level of the lower surface of the flat plate 4. More specifically, for example, given that the electronic component has a rectangular shape, then three out of the four sides thereof may be kept in contact with the flat plate 4 in the flat-plate through hole 5. Moreover, even if the four sides of the electronic component 22 make contact with the flat plate 4, it will do no harm as long as the side is not entirely contacted by the flat plate 4.

In the step of forming, in the frame body 2, the electronic component connection pad 33 to which the electronic component 22 is connected, a difference in thickness is generally produced between the plurality of electronic component connection pads 33. Correspondingly, when the electronic component 22 is connected to the frame body 2, a difference in thickness is produced between connecting materials 34 for joining the electronic component connection pads 33 to the electronic component 22. Due to such a difference, the lower surface of the electronic component 22 could be located below the level of the lower surface of the flat plate 4, wherefore the level of the inside of the image pickup element mounting substrate 1 could vary from place to place. This causes the image pickup device 21 to be inclined when mounted in an external circuit or external housing, in consequence whereof there results misalignment in optical axis or image noise as a matter of concern.

With this in view, as exemplified in FIGS. 1 and 2, in this construction, the flat-plate through hole 5 is formed so as to pass through the flat plate 4, and, the electronic component 22 is housed in a region surrounded by the inner wall of the flat-plate through hole 5 and the lower surface of the frame body 2. Moreover, the lower surface of the electronic component 22 is located above the level of the lower surface of the flat plate 4. Since the lower surface of the electronic component 22 is located above the level of the lower surface of the flat plate 4, it follows that the flat plate 4 alone makes direct contact with an external circuit or external housing. It is thus less likely that the height of the image pickup element mounting substrate 1 will vary from place to place. Consequently, the image pickup element mounting substrate 1 can be restrained against inclination even when placed in an external circuit or external housing.

In the example shown in FIGS. 1 and 2, the electronic component connection pad 33 is disposed on the lower surface of the frame body 2, and, the electronic component 22 is housed in the region surrounded by the lower surface of the frame body 2 and the inner wall of the flat-plate through hole 5 of the flat plate 4.

As the electronic component 22, for example, a chip capacitor, an inductor, a resistor, or a transistor is used. In the example shown in FIGS. 1 and 2, each electrode of the electronic component 22 is electrically connected to the electronic component connection pad 33 by the connecting material 34. As the connecting material 34, for example, an electrically conductive metallic member such as solder or anisotropic conductive resin is used. Moreover, as will hereafter be described, the region surrounded by the inner wall of the flat-plate through hole 5 and the lower surface of the frame body 2 may be sealed with, for example, insulating resin after the mounting of the electronic component 22.

As exemplified in FIGS. 1 and 2, the flat-plate through hole 5 of the flat plate 4 may pass through the flat plate 4 so as to extend from the upper surface to the lower surface thereof as seen in a sectional view, or, as will hereafter be described, may extend from the upper surface of the flat plate 4 to a point midway between the upper surface and the lower surface thereof in the thickness direction, as seen in a sectional view. As in the example shown in FIG. 1(b), in the case where the flat-plate through hole 5 passes through the flat plate 4 so as to extend from the upper surface to the lower surface thereof as seen in a sectional view, the inspection of mounting of the electronic component 22 can be visually performed.

Moreover, for example, in the step of mounting a lid body 12, the step of mounting a lens housing, or the step of mounting the image pickup element 10, a pressure is generally applied from above the upper surface of the image pickup element mounting substrate 1 toward the lower surface thereof. Therefore, if the flat plate 4 is configured so as to lie only inwardly from the electronic component 22 (lie only around the image pickup element mounting section 11) as seen in a plan view, depending upon a point of the construction to the pressure is applied, the image pickup element mounting substrate 1 will be inclined, which may result in mounting failure. In this regard, as in the example shown in FIG. 1, by configuring the flat plate 4 of the image pickup element mounting substrate 1 so as to surround the electronic component 22 (so that the electronic component 22 may be housed in the flat-plate through hole 5 formed in the flat plate 4), even if a pressure is applied from above the upper surface of the frame body 2 in the step of mounting the lid body 12, the step of mounting the lens housing, or the step of mounting the image pickup element 10, it is possible to reduce the inclination of the image pickup element mounting substrate 1.

Moreover, in the flat-plate through hole 5 passing through the flat plate 4, the electronic component 22 may be disposed on the lower surface of the frame body 2 (the bottom of the flat-plate through hole 5) in close proximity to the inner wall of the flat-plate through hole 5. With this arrangement, even if the so-called Manhattan phenomenon occurs in the step of mounting the electronic component 22, since the electronic component 22 readily catches against the inner wall of the flat-plate through hole 5, it is possible to restrain the electronic component 22 from protruding from the lower surface of the flat plate 4.

Moreover, the electronic component 22 may be disposed in close proximity to, of the inner wall of the flat-plate through hole 5, at least a part thereof located close to the lower surface of the flat plate 4. This constitution enables the electronic component 22 to catch against the inner wall of the flat-plate through hole 5 more readily. Thus designed, the inner wall of the flat-plate through hole 5 affords this advantageous effect regardless of the presence or absence of inclination.

Moreover, as in the example shown in FIG. 2, the flat-plate through hole 5 may be configured so that the opening 5a located close to the lower surface of the flat plate 4 is smaller than the opening 5a located close to the upper surface of the flat plate 4. With this configuration, since the electronic component 22 is disposed in close proximity to a part of the inner wall of the flat-plate through hole 5 which part is located close to the lower surface of the flat plate 4, it is possible to facilitate the catching of the electronic component 22 against the inner wall of the flat-plate through hole 5, as well as to attach the connecting material 34 in fillet form to an acute-angled corner defined by the upper surface of the flat plate 4 and the lower surface of the frame body 2. Thus, the adhesion of the electronic component 22 to the frame body 2 is enhanced, and also the electronic component 22 is restrained from protruding from the lower surface of the flat plate 4.

Next, the image pickup device 21 will be described with reference to FIGS. 1 and 2. In the example shown in FIGS. 1 and 2, the image pickup device 21 comprises the image pickup element mounting substrate 1, the image pickup element 10 mounted on the image pickup element mounting section 11, and the lid body 12 joined to the upper surface of the image pickup element mounting substrate 1.

As the image pickup element 10, for example, a CCD-type image pickup element or a CMOS-type image pickup element is used. In the example shown in FIGS. 1 and 2, each electrode of the image pickup element 10 is electrically connected to the image pickup element connection pad 3 via the connecting member (bonding wire) 13.

Moreover, in the example shown in FIGS. 1 and 2, the image pickup element 10 is disposed on the upper surface of the flat plate 4 via an adhesive. For example, a material such as silver epoxy resin or thermosetting resin is used as the adhesive.

The lid body 12 is shaped in a flat plate, for example. Moreover, the lid body 12 is constructed of a member with a high degree of transparency such as a glass material or an optical filter. The lid body 12 is joined to the upper surface of the frame body 2 via a joining member 14 such for example as thermosetting resin or low-melting-point glass.

The image pickup device 21 according to the invention, comprising the image pickup element mounting substrate 1 having the above-described structure and the image pickup element 10 mounted on the image pickup element mounting section 11, permits reduction in inclination of the image pickup device 21 and hence reduction in optical-axis misalignment and generation of image noise. Consequently, there is provided the image pickup device 21 capable of producing images of good quality.

Next, an example of a method for manufacturing the image pickup element mounting substrate 1 in this embodiment will be described. The following manufacturing method is through the use of a segmentable wiring substrate.

(1) At first, a ceramic green sheet for constituting the frame body 2 is formed. For example, in the case where the frame body 2 made of an aluminum oxide ($Al_2O_3$) sintered body is obtained, for example, powder of silica ($SiO_2$), magnesia (MgO), or calcia (CaO) serving as a sintering aid is added to $Al_2O_3$ powder, and, after further addition of suitable binder, solvent, and plasticizer, the powder mixture so obtained is kneaded into slurry form. After that, a segmentable ceramic green sheet is obtained from the slurry by a heretofore known molding technique such as the doctor blade method or the calendar roll method.

For example, in the case where the frame body 2 is formed of resin, the frame body 2 may be obtained by molding the resin by transfer molding, injection molding, or otherwise using a mold capable of providing a molded body of predetermined shape.

Moreover, the frame body 2 may be made of a composite in which a base material made of glass fiber is impregnated with a resin, such as glass epoxy resin. In this case, the frame body 2 may be formed by impregnating a glass fiber-made base material with a precursor of epoxy resin, and subsequently curing the epoxy resin precursor under heat at a predetermined temperature.

(2) Next, a metallic paste is applied to or charged into the areas of the ceramic green sheet obtained in Step (1) which areas correspond to the image pickup element connection pad 3, the external circuit connection electrode, internal wiring including a through conductor or internal wiring line, the through conductor, and the electronic component connection pad 33, respectively, by screen printing or otherwise.

The metallic paste is prepared by kneading metallic powder made of the above-described metal material in admixture with suitable solvent and binder until the viscosity is adjusted to an appropriate level. Glass or ceramics may be included in the metallic paste to enhance the strength of adhesion with the frame body 2.

(3) Next, the described green sheet is worked using a mold or the like. The through hole 2a is formed at a central portion of the green sheet which constitutes the frame body 2.

(4) Next, a ceramic green sheet stacked body which constitutes the frame body 2 is produced by laminating insulating layer-forming ceramic green sheets together under pressure. Alternatively, in this step, a green sheet stacked body which constitutes the frame body 2 may be produced by, for example, forming a green sheet stacked body which constitutes the first frame body 2d and a green sheet stacked body which constitutes the second frame body 2e separately, and subsequently laminating these green sheet stacked bodies together under pressure.

(5) Next, the ceramic green sheet stacked body is fired at a temperature of about 1500 to 1800° C. to obtain a segmentable wiring substrate bearing an arrangement of a plurality of frame bodies 2. In this step, the above-described metallic pastes are fired concurrently with the firing of the ceramic green sheet which constitutes the frame body 2 into the image pickup element connection pad 3, the external circuit connection electrode, the internal wiring, the through conductor, and the electronic component connection pad 33, respectively.

(6) Next, the segmentable wiring substrate thus obtained in the firing step is divided into a plurality of frame bodies 2. The division is effected by a technique to break the segmentable wiring substrate along dividing grooves formed in the positions thereof corresponding to the outer edges of the frame bodies 2, or a technique to cut the segmentable wiring substrate along the positions thereof corresponding to the outer edges of the frame bodies 2 by slicing or otherwise. The dividing groove may be obtained by forming a small incision whose dimension is smaller than the thickness of the segmentable wiring substrate in the segmentable wiring substrate after the firing step with use of a slicing machine, or may alternatively be obtained by pressing a cutter blade against the ceramic green sheet stacked body which constitutes the segmentable wiring substrate, or by forming a small incision whose dimension is smaller than the thickness of the ceramic green sheet stacked body in the ceramic green sheet stacked body with use of a slicing machine.

(7) Next, the flat plate 4 which is joined to the lower surface of the frame body 2 is prepared. The flat plate 4 is produced by subjecting a metal-made plate-like material to heretofore known punching process using a stamping die or etching process. After that, in the case where the flat plate 4 is formed of a metal material such as a Fe—Ni—Co alloy, 42 Alloy, Cu, or a copper alloy, a nickel plating layer and a gold plating layer may be deposited on the surface of the flat plate 4. This makes it possible to retard oxidative corrosion of the surface of the flat plate 4 with high effectiveness.

In the case where the flat plate 4 is formed of a resin material, the flat plate 4 may be obtained by transfer molding, injection molding, or otherwise. Moreover, a composite in which a base material made of glass fiber is impregnated with a resin, such for example as glass epoxy resin, may be used for the flat plate 4. In this case, the flat plate 4 may be formed by impregnating a glass fiber-made base material with a precursor of epoxy resin, and subsequently curing the epoxy resin precursor under heat at a predetermined temperature. At this time, a circuit may be formed by a deposition of a metal material such as copper printed on the upper surface or lower surface of the epoxy resin precursor by screen printing or otherwise.

(8) Next, the flat plate 4 is joined to the frame body 2 via a joining material. In this step, a thermosetting resin in paste form is applied to one of the joining faces of the frame body 2 and the flat plate 4 by screen printing, a dispensing system, or otherwise. After that, following drying operation using an atmosphere furnace of tunnel type, an oven, or the like, the frame body 2 and the flat plate 4 are placed in a stacked condition in the atmosphere furnace of tunnel type or oven, and are heated at about 150° C. for about 90 minutes to cure the joining material under heat, whereupon the frame body 2 and the flat plate 4 are firmly bonded together.

As a base resin of the joining material, for example, bisphenol A liquid epoxy resin, bisphenol F liquid epoxy resin, or phenol novolac liquid resin is used. The joining material is obtained by adding a spherical filler material made of e.g. silicon oxide, a hardener predominantly composed of e.g. acid anhydride such as tetrahydromethylphthalic anhydride, and a coloring agent e.g. carbon powder to the base resin, and subsequently mixing and kneading the described materials into paste form by a centrifugal agitator or the like.

In addition to the aforenamed materials, for example, use can be made of a material composed of epoxy resin, such as bisphenol A epoxy resin, bisphenol A modified epoxy resin, bisphenol F epoxy resin, phenol novolac epoxy resin, cresol novolac epoxy resin, special novolac epoxy resin, phenolic derivative epoxy resin, or bisphenol skeletal epoxy resin, with a hardener added, for example, an imidazole-based hardener, an amine-based hardener, a phosphorus-based hardener, a hydrazine-based hardener, an imidazole adduct-based hardener, an amine adduct-based hardener, a cationic polymer-based hardener, or a dicyandiamide-based hardener.

Moreover, in the case where the flat plate 4 is made of a resin material and has a circuit formed on the upper or lower surface thereof, the frame body 2 and the flat plate 4 may be electrically joined to each other via anisotropic conductive resin used as the joining material.

(9) Next, the electronic component 22 is joined to the image pickup element mounting substrate 1 thus produced. The electronic component 22 is mounted in the position of the electronic component connection pad 33 disposed on the lower surface of the frame body 2 via the electrically conductive connecting material 34 such as solder. The mounting of the electronic component 22 in the frame body 2 may be performed either after the joining together of the frame body 2 and the flat plate 4 or before the joining operation, or may also be performed after the mounting of the image pickup element 10. Moreover, the flat-plate through hole 5 may be sealed with insulating resin or the like after the mounting of the electronic component 22.

The image pickup element mounting substrate 1 is obtained by following Steps (1) to (9). Note that Steps (1) to (9) do not necessarily have to be carried out in the order presented.

The image pickup device 21 is produced by mounting the image pickup element 10 on the image pickup element mounting section 11 of the thereby constructed image pickup element mounting substrate 1.

Second Embodiment

The image pickup element mounting substrate 1 and the image pickup device 21 in accordance with a second embodiment of the invention will be described with reference to FIGS. 3 and 4.

Figure 3:
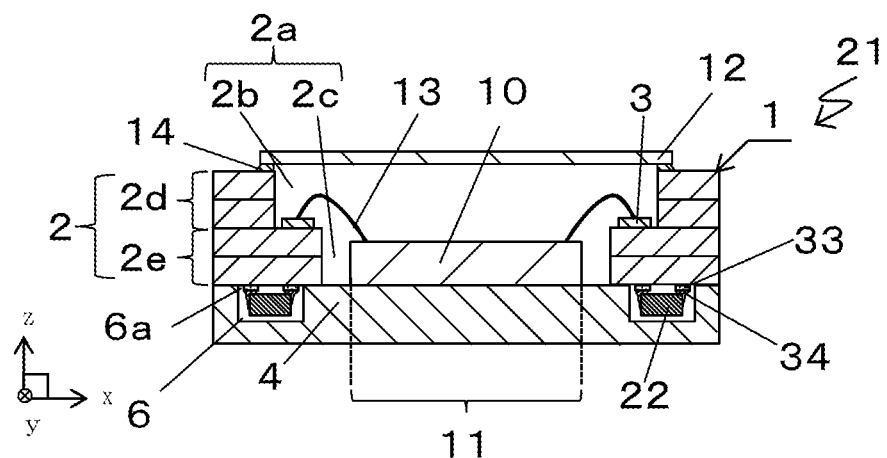
FIGS. 3(a) and 3(b) are each a sectional view showing the image pickup element mounting substrate and the image pickup device in accordance with a second embodiment of the invention.
Figure 3:
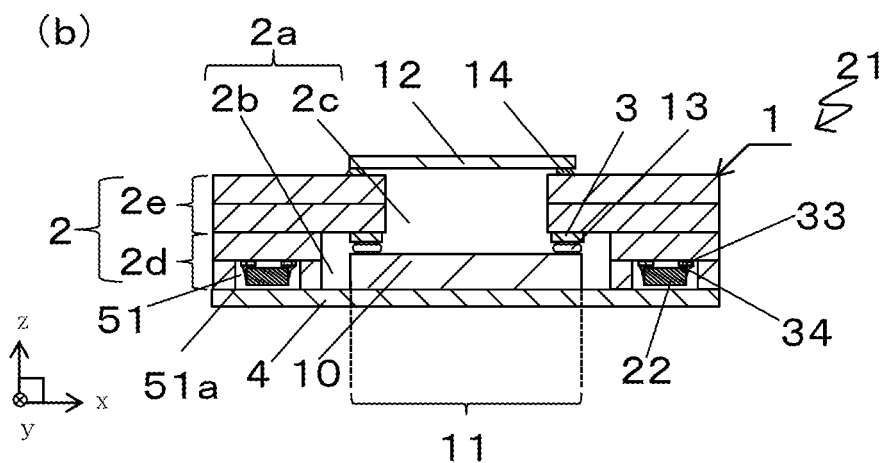
Figure 4:
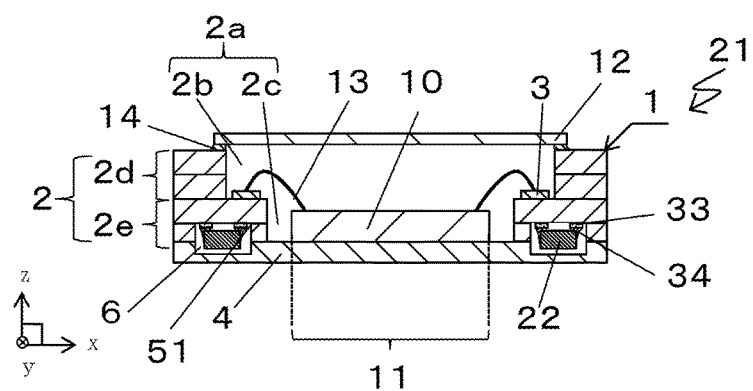
FIG. 4 is a sectional view showing the image pickup element mounting substrate and the image pickup device in accordance with another example of the second embodiment of the invention.

FIGS. 3 and 4 are sectional views of this embodiment. In FIG. 3(a), there is shown an example in which the flat plate 4 is provided with a flat-plate recess 6, whose depth is smaller than the thickness of the flat plate 4, formed at a part of the upper surface thereof which part overlaps with the electronic component 22. Moreover, in FIG. 3(b), there is shown an example in which the frame body 2 is provided with a frame-body recess 51 formed at a part of a lower surface thereof on which the electronic component 22 is mounted. In addition, in FIG. 4, there is shown an example in which the flat-plate recess 6 and the frame-body recess 51 are formed in the flat plate 4 and the frame body 2, respectively, so as to overlap with each other.

The image pickup device 21 in this embodiment differs from the image pickup device 21 in the first embodiment in that, in contrast to the flat-plate through hole 5, the flat-plate recess 6 of the flat plate 4 does not pass through the flat plate 4 so as to extend from the upper surface to the lower surface thereof. The frame-body recess 51 is formed by recessing upwardly a part of the lower surface of the frame body 2 on which the electronic component 22 is mounted.

In the example shown in FIG. 3(a), the electronic component 22 is disposed on the lower surface of the frame body 2, and, there is provided the flat-plate recess 6 having an opening 6a at the upper surface of the flat plate 4. Moreover, in the example shown in FIG. 3(b), there is provided the frame-body recess 51 having an opening 51a at the lower surface of the frame body 2, and, the electronic component 22 is disposed on the bottom of the frame-body recess 51. In addition, in the example shown in FIG. 4, the lower surface of the frame body 2 is formed with the frame-body recess 51, and, the upper surface of the flat plate 4 is formed with the flat-plate recess 6. In the example shown in each of FIGS. 3 and 4, there is no opening at the lower surface of the flat plate 4. The flat plate 4 having an opening-free lower surface makes it possible to reduce the possibility that the lower surface of the electronic component 22 will be located below the level of the lower surface of the flat plate 4 without fail.

Moreover, in the case of providing the flat plate 4 with the flat-plate through hole 5 passing through the flat plate 4 so as to extend from the upper surface to the lower surface thereof, the flat plate 4 is generally subjected to punching operation using a punching die, for example. At this time, a downwardly-protruding burr could be left on the opening formed at the lower surface of the flat plate 4, or opening distortion could appear. A contact of the downwardly-protruding burr or distorted area with an external housing and so forth could cause the image pickup element mounting substrate 1 to incline. In this regard, as practiced in this construction, the absence of an opening at the lower surface of the flat plate 4 makes it possible to effectively reduce the likelihood that the image pickup element mounting substrate 1 will be mounted in an inclined condition.

Moreover, in recent years, the image pickup element mounting substrate 1 has recently come to be increasingly smaller, and the electronic component 22 such as a chip capacitor has recently come to be increasingly smaller as well. As a consequence of this trend, the distance between the plurality of electronic component connection pads 33, the distance between the electronic component connection pad 33 and the flat plate 4, and the distance between the electronic component 22 and the flat plate 4 are each on the decrease. Therefore, if dust such as dirt or moisture finds its way into a region for the placement of the electronic component 22 surrounded by the lower surface of the frame body 2 and the inner wall of the flat-plate recess 6, short-circuiting could occur between the plurality of electronic component connection pads 33, between the electronic component connection pad 33 and the flat plate 4, or between the electronic component 22 and the flat plate 4. In this regard, in this construction, the flat plate 4 is provided with the flat-plate recess 6 which does not pass through the flat plate 4 so as to extend from the upper surface to the lower surface thereof, and hence has no opening at the lower surface thereof. This makes it possible to reduce the described dust intrusion, and thereby reduce occurrence of short-circuiting between the plurality of electronic component connection pads 33, between the electronic component connection pad 33 and the flat plate 4, or between the electronic component 22 and the flat plate 4.

Moreover, in the example shown in FIG. 3(b), the frame-body recess 51 is formed in the frame body 2, but the flat-plate recess 6 is not formed in the flat plate 4. Thus, the process of forming the flat-plate through hole 5 or the flat-plate recess 6 in the flat plate 4 can be omitted, wherefore the stress applied to the flat plate 4 during the formation of the flat-plate through hole 5 or the flat-plate recess 6 can be reduced. This makes it possible to maintain the planarity of the lower surface of the flat plate 4, and thereby reduce an inclination of the image pickup element mounting substrate 1. Moreover, since the stress on the flat plate 4 can be reduced, it is possible to render the flat plate 4 lower in profile. Thus, for example, in the case where the flat plate 4 is formed of a metal material, a larger amount of heat generated in the operation of the image pickup element 10 can be dissipated by an external housing or an external heat sink, for example.

Moreover, as in the example shown in FIG. 3(b), in the image pickup device 21, an electrode on the upper surface of the image pickup element 10 may be flip-chip mounted on the image pickup element connection pad 3 disposed on the lower surface of the frame body 2 via a connecting member 13 made of a gold bump, for example.

In the example shown in FIG. 4, the lower surface of the frame body 2 is formed with the frame-body recess 51, and, the upper surface of the flat plate 4 is formed with the flat-plate recess 6. The flat-plate recess 6 is formed in a part of the upper surface of the flat plate 4 which part overlaps with the frame-body recess 51. Thus, both of the frame body 2 and the flat plate 4 are provided with a recess, and the electronic component 22 is mounted in a space defined by the two recesses. In this case, for example, even if the electronic component 22 is greater in thickness than a single insulating layer constituting the flat plate 4 or the frame body 2, it can be housed properly. Moreover, since the thickness of each of the flat plate 4 and the frame body 2 can be reduced, it is possible to render the image pickup element mounting substrate 1 lower in profile. In addition, since the thickness of each insulating layer of the frame body 2 can be reduced, it is possible to improve the electrical characteristics of wiring set in each insulating layer.

Third Embodiment

Next, the image pickup element mounting substrate 1 and the image pickup device 21 in accordance with a third embodiment of the invention will be described with reference to FIG. 5. Note that the illustration of the lid body 12 is omitted from FIG. 5 showing the image pickup device 21.

The image pickup device 21 in this embodiment differs from the image pickup device 21 in the second embodiment in that there is provided a frame-body through hole 51 which passes through the frame body 2 so as to extend from the upper surface to the lower surface thereof, as seen in a sectional view.

Figure 5:
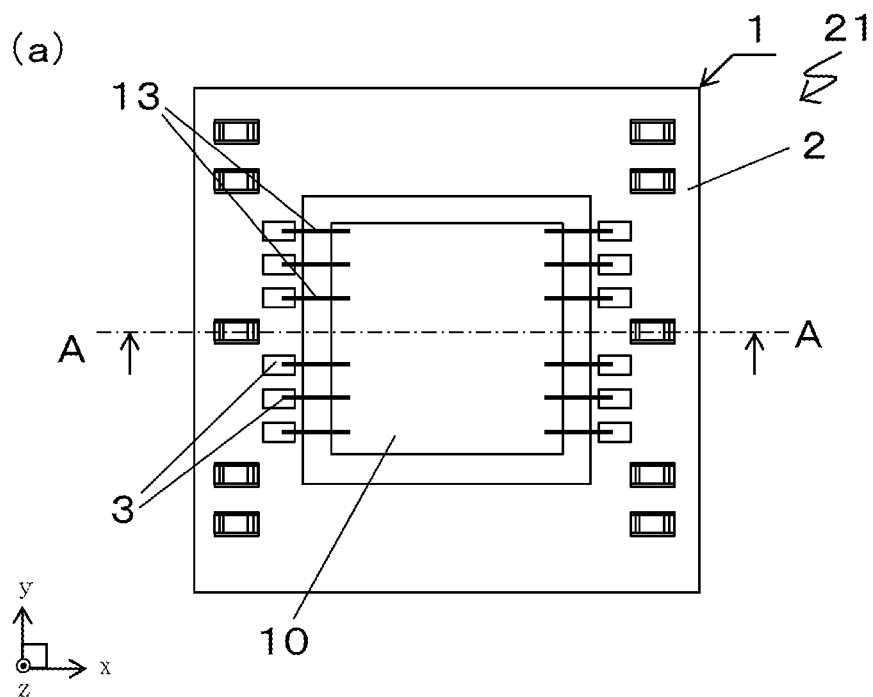
FIG. 5(a) is a top view showing the appearance of an image pickup element mounting substrate and an image pickup device in accordance with a third embodiment of the invention.
FIG. 5(b) is a vertical sectional view taken along the line A-A shown in FIG. 5(a)
Figure 5:
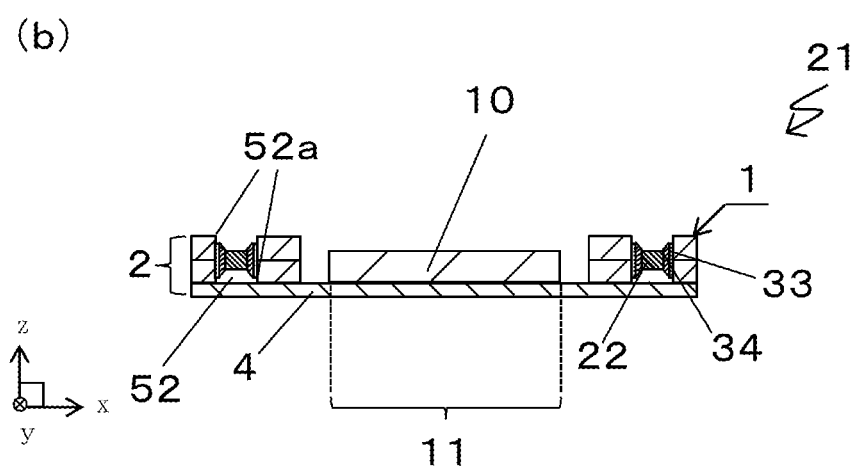

In the example shown in FIG. 5, the frame body 2 has the frame-body through hole 52 having an opening 52a at a lower surface thereof, and, the frame-body through hole 52 passes through the frame body 2 so as to extend the upper surface thereof. Thus, the electronic component 22 is housed in the frame-body through hole 52 which passes through the frame body 2 so as to extend from the upper surface to the lower surface thereof, and, the flat plate 4 is disposed so as to cover the frame-body through hole 52 having the opening 52a at the lower surface side. This construction makes it possible to restrain the electronic component 22 from protruding from the lower surface of the flat plate 4 without fail, and thereby reduce an inclination of the image pickup element mounting substrate 1. Moreover, since the flat plate 4 is disposed so as to seal the lower surface side of the frame body 2, it is possible to restrain the electronic component 22 from lying too close to the bottom of the frame body 2.

Moreover, as practiced in this construction, in the case where electrical conduction between the electronic component 22 and the frame body 2 is established at the side surface of the electronic component 22 and the side surface of the frame-body through hole 52 of the frame body 2, the thickness of the frame body 2 can be adjusted to be substantially the same as that of the electronic component 22. This makes it possible to render the image pickup element mounting substrate 1 even lower in profile, as well as to achieve an improvement in electrical characteristics.

Fourth Embodiment

Next, the image pickup element mounting substrate 1 and the image pickup device 21 in accordance with a fourth embodiment of the invention will be described with reference to FIG. 6. Note that the illustration of the lid body 12 is omitted from FIG. 6 showing the image pickup device 21.

The image pickup device 21 in this embodiment differs from the image pickup device 21 in the third embodiment in that the frame-body through hole 52 of the frame body 2 and the flat-plate through hole 5 of the flat plate 4 communicate with each other to define a continuous hole. The flat-plate through hole 5 is formed in a position which overlaps with the electronic component 22 so as to pass vertically through the flat plate 4.

Figure 6:
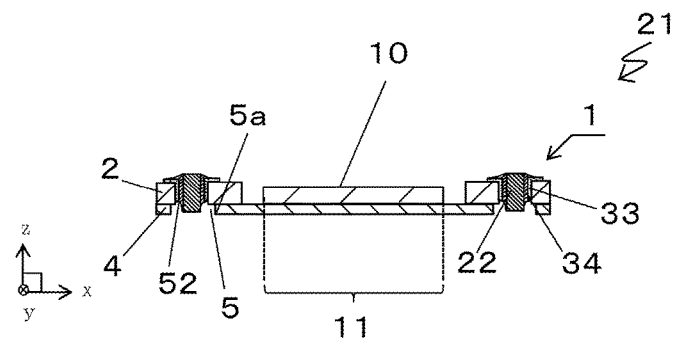
FIG. 6 is a sectional view showing the image pickup element mounting substrate and the image pickup device in accordance with an example of a fourth embodiment of the invention.

In the example shown in FIG. 6, the flat plate 4 has the flat-plate through hole 5 having an opening 5a at an upper surface thereof, and, the flat-plate through hole 5 passes through the flat plate 4 so as to extend to the lower surface thereof. The electronic component 22 is housed in the frame-body through hole 52 of the frame body 2. Thus, the frame-body through hole 52 of the frame body 2 and the flat-plate through hole 5 of the flat plate 4 are combined to define a continuous hole, and the electronic component 22 is housed in the continuous hole. This makes it possible to adjust the thickness of the frame body 2 or the sum of the thicknesses of the frame body 2 and the flat plate 4 to be smaller than the thickness of the electronic component 22, and thereby render the image pickup element mounting substrate 1 even lower in profile. In this case, the electronic component 22 is mounted so as to protrude upward from the frame body 2, with a lower surface thereof located above the level of the lower surface of the flat plate 4.

Fifth Embodiment

Next, the image pickup element mounting substrate 1 and the image pickup device 21 in accordance with a fifth embodiment of the invention will be described with reference to FIG. 7.

The image pickup device 21 in this embodiment differs from the image pickup device 21 in the first embodiment in that the lower surface of the frame body 2 is formed with a frame-body recess 51, and the frame-body recess 51 is sealed with a sealing material 35.

Figure 7:
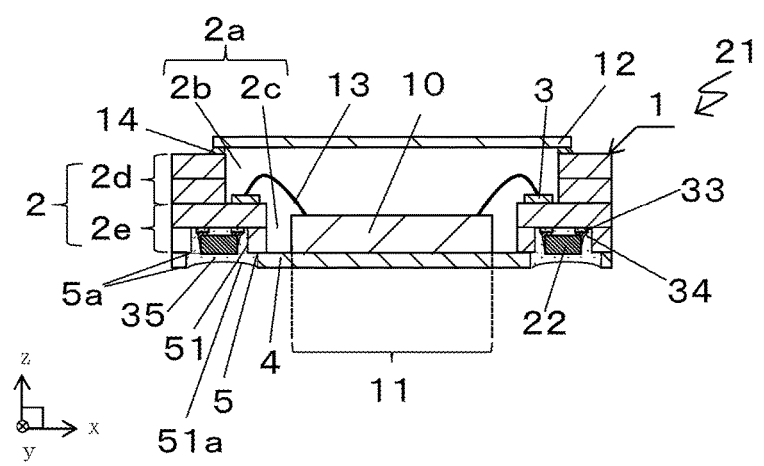
FIG. 7 is a sectional view showing the image pickup element mounting substrate and the image pickup device in accordance with an example of a fifth embodiment of the invention.

In the example shown in FIG. 7, there are provided the frame-body recess 51 formed at the lower surface of the frame body 2 and the flat-plate through hole 5 which passes through the flat plate 4 so as to extend from the upper surface to the lower surface thereof. The electronic component 22 is mounted on the bottom of the frame-body recess 51 formed at the lower surface of the frame body 2, and, the frame-body recess 51 of the frame body 2 and the flat-plate through hole 5 of the flat plate 4 are sealed with the sealing material 35. This makes it possible to reduce intrusion of dust such as dirt or moisture, and thereby reduce occurrence of short-circuiting between the plurality of electronic component connection pads 33, between the electronic component connection pad 33 and the flat plate 4, or between the electronic component 22 and the flat plate 4. Moreover, it is advisable that the lower surface of the sealing material 35 is located above the level of the lower surface of the flat plate 4. The sealing material 35 is made of thermosetting resin such as epoxy resin.

Moreover, as shown in FIG. 7, it is advisable that the opening 5a of the flat-plate through hole 5 formed in the flat plate 4 is larger than the opening 51a of the frame-body recess 51 formed in the frame body 2. In this case, even if the frame body 2 and the flat plate 4 become misaligned when joined to each other, it is possible to reduce the possibility that the electronic component 22 cannot be mounted properly or the possibility that the electronic component 22 will protrude in a slanting position from the lower surface of the flat plate 4 when mounted. Moreover, since a shoulder can be defined by the arrangement of the frame body 2 and the flat plate 4, when effecting sealing by the sealing material 35, an excess of the sealing material 35 spreads over the shoulder. This makes it possible to reduce the likelihood that the lower surface of the sealing material 35 will be located below the level of the lower surface of the flat plate 4, and thereby reduce an inclination of the image pickup element mounting substrate 1.

It should be understood that the application of the invention is not limited to the embodiments described heretofore, and that relevant numerical values may be changed, or various modifications may be made in the design of the construction except for parts constituting the essence of the invention. For example, although, in the example shown in FIGS. 1 to 7, the frame body 2 has the rectangular through hole 2a (rectangular inside shape), the through hole 2a may be given a circular shape or other polygonal shape than the rectangular shape. Moreover, there is no particular limitation to the arrangement, number, configuration, and so forth as to the image pickup element connection pads 3 or the electronic component connection pads 33. In addition, there is no particular limitation to the arrangement, number, configuration, and so forth as to the recesses or through holes provided in each embodiment.

The invention claimed is:

1. An image pickup element mounting substrate, comprising:
    a frame body composed of an insulating layer, a through hole being defined by an internal periphery of the frame body;
    an electronic component mounted on a lower outer surface of the frame body; and
    a flat plate which is disposed on the lower outer surface of the frame body and covers an opening of the through hole while being partly kept in out-of-contact with the electronic component, the flat plate comprising an image pickup element mounting section at a first part of an upper surface of the flat plate, the first part of the upper surface being surrounded by the frame body,
    a lower surface of the electronic component being located above a level of a lower surface of the flat plate.

2. The image pickup element mounting substrate according to claim 1,
    wherein the flat plate is provided with a flat-plate recess formed at a second part of the upper surface of the flat plate, the second part of the upper surface overlapping with the electronic component.

3. The image pickup element mounting substrate according to claim 1,
    wherein the flat plate is provided with a flat-plate through hole formed in a position which overlaps with the electronic component.

4. An image pickup device, comprising:
    the image pickup element mounting substrate according to claim 1;
    an image pickup element mounted on the image pickup element mounting section of the flat plate; and
    a lid body which is joined to an upper surface of the frame body and seals an interior of the frame body.

5. The image pickup element mounting substrate according to claim 1, wherein the flat plate is directly connected to the frame body.

6. An image pickup element mounting substrate, comprising:
    a frame body composed of an insulating layer, a through hole being defined by an internal periphery of the frame body, the frame body being provided with a frame-body recess which opens on a lower outer surface of the frame body;
    an electronic component mounted in the frame-body recess; and
    a flat plate which is disposed on the lower outer surface of the frame body and covers an opening of the through hole while being partly kept in out-of-contact with the electronic component, the flat plate comprising an image pickup element mounting section at a first part of an upper surface of the flat plate, the first part of the upper surface being surrounded by the frame body,
    a lower surface of the electronic component being located above a level of a lower surface of the flat plate.

7. The image pickup element mounting substrate according to claim 6,
    wherein the flat plate is provided with a flat-plate recess formed at a second part of the upper surface of the flat plate, the second part of the upper surface overlapping with the frame-body recess.

8. The image pickup element mounting substrate according to claim 6,
    wherein the flat plate is provided with a flat-plate through hole formed in a position which overlaps with the electronic component.

9. An image pickup device, comprising:
    the image pickup element mounting substrate according to claim 6;
    an image pickup element mounted on the image pickup element mounting section of the flat plate; and
    a lid body which is joined to an upper surface of the frame body and seals an interior of the frame body.

10. The image pickup element mounting substrate according to claim 6, wherein the flat plate is directly connected to the frame body.

* * * * *